(12) United States Patent
Mitome et al.

(10) Patent No.: US 6,640,332 B2
(45) Date of Patent: Oct. 28, 2003

(54) WIRING PATTERN DECISION METHOD CONSIDERING ELECTRICAL LENGTH AND MULTI-LAYER WIRING BOARD

(75) Inventors: Hiroyuki Mitome, Hadano (JP); Katsuyuki Itoh, Hadano (JP)

(73) Assignee: Hitachi, Ltd., Tokyo (JP)

( * ) Notice: Subject to any disclaimer, the term of this patent is extended or adjusted under 35 U.S.C. 154(b) by 60 days.

(21) Appl. No.: 09/864,865

(22) Filed: May 23, 2001

(65) Prior Publication Data

US 2002/0089830 A1 Jul. 11, 2002

(30) Foreign Application Priority Data

May 23, 2000 (JP) .......................... 2000-155953

(51) Int. Cl.[7] .......................... G06F 17/50; G06F 9/45; H01R 12/04; H05K 1/14; G01R 31/28
(52) U.S. Cl. ................. 716/15; 716/1; 716/2; 716/6; 716/9; 716/10; 716/12; 716/13; 716/14; 174/261; 174/262; 361/736; 361/792; 714/724; 714/726
(58) Field of Search ................... 716/1–21; 174/261, 174/262; 307/106; 326/86; 327/292, 565; 333/161; 336/200; 361/714, 736, 792; 438/113; 439/66; 700/56; 703/19; 706/13; 709/208; 713/500; 714/724, 726

(56) References Cited

U.S. PATENT DOCUMENTS 4,630,219 A * 12/1986 DiGiacomo et al. ........... 716/9
4,908,576 A * 3/1990 Jackson ...................... 714/726
5,550,748 A * 8/1996 Xiong ......................... 716/13
5,889,677 A * 3/1999 Yasuda et al. ................. 716/6
6,301,686 B1 * 10/2001 Kikuchi et al. ................ 716/2
6,359,237 B1 * 3/2002 Tohya et al. ................ 174/261

FOREIGN PATENT DOCUMENTS

| JP | 07-240600 | 9/1995 |
| JP | 08-320894 | 12/1996 |

* cited by examiner

*Primary Examiner*—Matthew Smith
*Assistant Examiner*—Y Rossoshek
(74) *Attorney, Agent, or Firm*—Townsend and Townsend and Crew LLP

(57) ABSTRACT

A method for determining a wiring pattern of a signal line for connection of a circuit on a multi-layer printed wiring board includes the steps of providing a constraint of an electrical length which the signal line must satisfy, determining an electrical length change at a discontinuous delay part of the signal line along which a signal propagates, determining a wiring route of the signal line, calculating an electrical length of the signal line with use of a wiring length of the signal line and the determined electrical length change, judging whether or not the calculated electrical length satisfies the electrical length constraint given to the signal line, and determining the wiring route as a wiring pattern when the electrical length constraint is satisfied as the decision result, thereby carrying out a wiring layout to make an electrical length constraint satisfied.

10 Claims, 5 Drawing Sheets

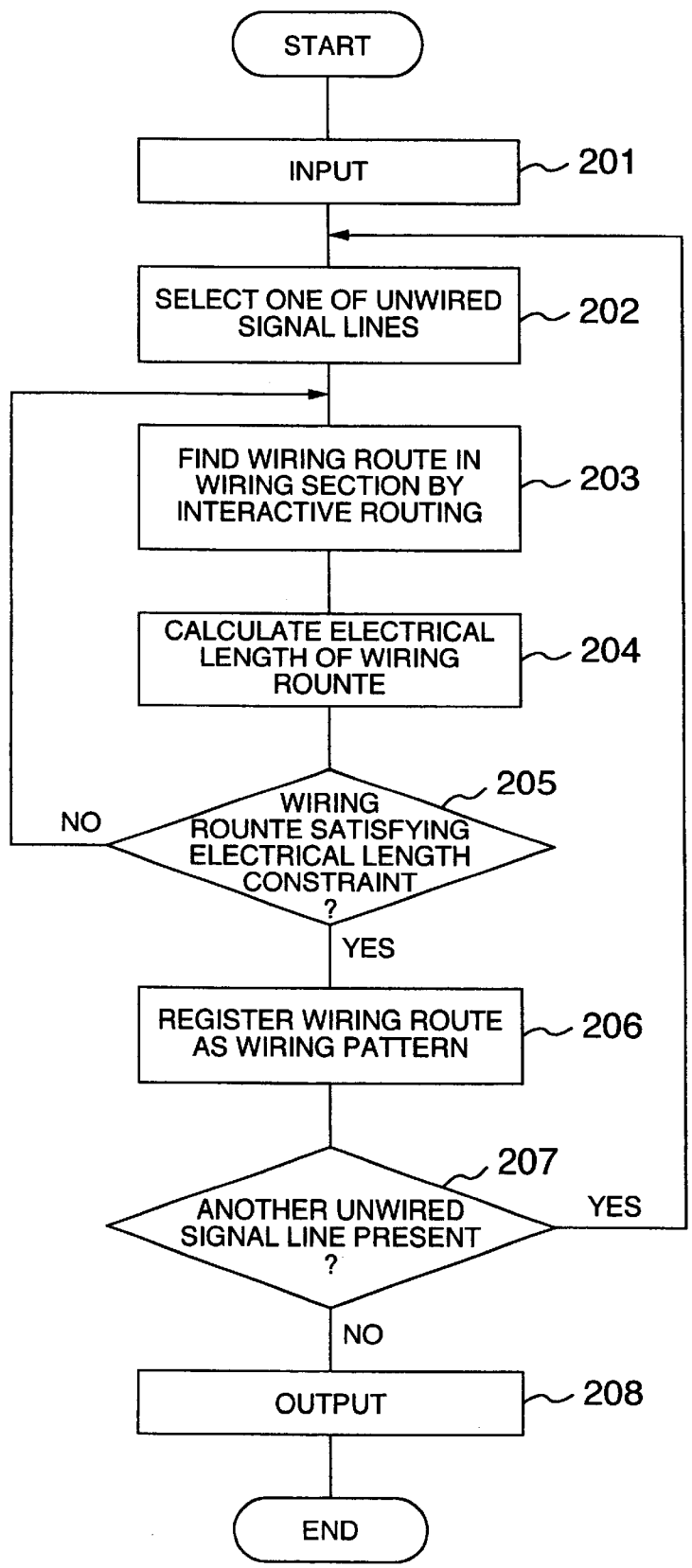

FIG. 3A
FIG. 3B
| BEND ANGLE | ELECTRICAL LENGTH CHANGE |
|---|---|
| $\theta_1$ | $\delta_1$ |
| $\theta_2$ | $\delta_2$ |
| $\theta_3$ | $\delta_3$ |
| --- | --- |
FIG. 3C
FIG. 3D
| THRU/VIA HOLE TYPE | ELECTRICAL LENGTH CHANGE |
|---|---|
| $V_1$ | $\delta'_1$ |
| $V_2$ | $\delta'_2$ |
| $V_3$ | $\delta'_3$ |
| --- | --- |
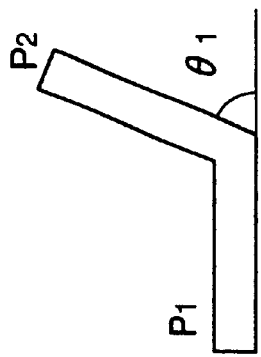
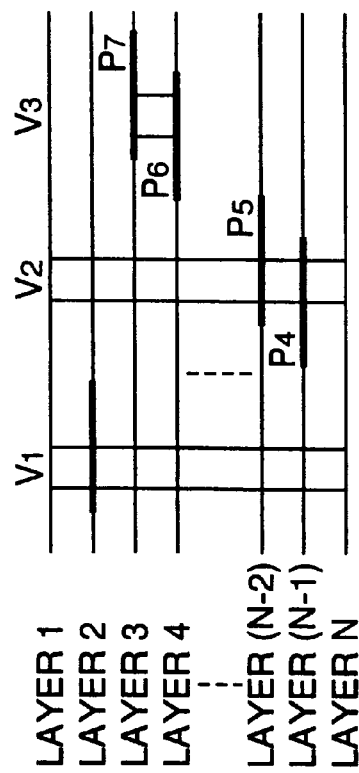

WIRING PATTERN DECISION METHOD CONSIDERING ELECTRICAL LENGTH AND MULTI-LAYER WIRING BOARD

BACKGROUND OF THE INVENTION

The present invention relates to methods for determining a wiring pattern on a multi-layer printed wiring board and more particularly, to a method for determining a suitable wiring pattern which is used when the operational frequency of a circuit on a multi-layer printed wiring board is high, and also relates to a multi-layer printed wiring board manufactured by the method.

In order to operate a circuit on a printed wiring board as desired, wiring has conventionally been carried out so that a wiring length is in an allowable range determined by the operational timing, etc. of the circuit.

However, in the case of a recent printed wiring board having a high operational frequency of a circuit thereon, problems with delay and reflection caused in a signal line become non-negligible, which requires the signal line to be treated as a transmission line.

More specifically, when the circuit has a low operational frequency, the amounts of such delay and reflection as mentioned above are smaller than its operational speed. For this reason, these influences were able to be ignored and thus an electrical length corresponding to the substantial length of the signal line was regarded as equal to the wiring length of the signal line without any problems. When the operational frequency becomes higher, however, these influences become non-negligible, which means the wiring length and the electrical "length" of the signal line must be separately considered.

SUMMARY OF THE INVENTION

It is therefore an object of the present invention to provide a method for wiring a multi-layer printed wiring board in such a manner that an electrical length of a signal line is accurately calculated and satisfies a given electrical length constraint, and also to provide a multi-layer printed wiring board manufactured by the method.

The above object is attained by providing a method for wiring a multi-layer printed wiring board which includes steps of providing an electrical length constraint which a signal line must satisfy, determining an electrical length change of the signal line at a discontinuous delay part thereof, calculating an electrical length of the signal line with use of a wiring length of the signal line and the determined electrical length change, and determining a wiring route in such a manner that the signal line satisfies the electrical length constraint.

It is also desirable that the step of determining an electrical length change include a step of determining an electrical length change to a bend angle between straight parts (which will be referred to as the wiring elements, hereinafter) of a wiring pattern and an electrical length change to thru and via holes.

In accordance with the present invention, there can be obtained a desired wiring pattern whose electrical length is suitably and accurately constrained. As a result, there can be realized a multi-layer printed wiring board which can mount a circuit having a high operational frequency thereon.

BRIEF DESCRIPTION OF THE DRAWINGS

FIG. 2 shows a flowchart for explaining the operation of a considered-electrical-length wiring processing controller 107;

FIGS. 3A–3D show examples of how to set a change in an electrical length;

DESCRIPTION OF THE EMBODIMENTS

In accordance with an embodiment of the present invention, there is provided a wiring method and multi-layer printed wiring board, in which an electrical length of a signal line is accurately calculated and wiring is carried out so that a given electrical length constraint is satisfied.

Figure 6A:
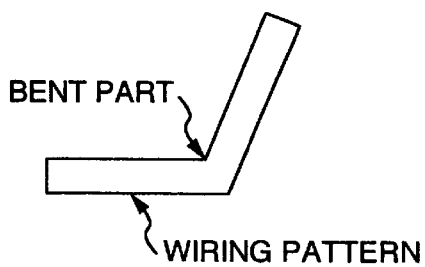
FIGS. 6A and 6B are diagrams for explaining a part of a signal line where delay becomes discontinuous.
Figure 6B:
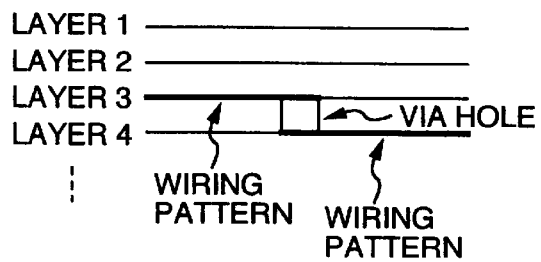

For a printed wiring board having a circuit with a high operational frequency, a signal line is usually treated as a transmission line. As characteristics of a transmission line, in general, a delay time in signal propagation is increased (a) at such a bend wiring part as shown in FIG. 6A or (b) at such a wiring layer change part through a via hole (passed through the board for vertical connection) as shown in FIG. 6B. The delay causes formation of an electrical length as the substantial length of the signal line.

Figure 7A:
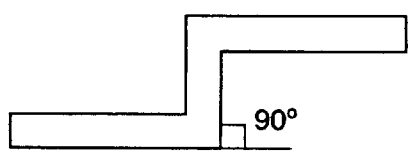
FIGS. 7A and 7B are diagrams for explaining a signal line in the prior art.
Figure 7B:
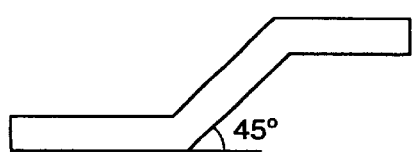

A technique relating to wiring electrical length is disclosed, for example, in JP-A-07-240600. This publication discloses an electrical-length equalizing wiring method, when a wiring bend angle is 90 degrees as shown in FIG. 7A or 45 degrees as shown in FIG. 7B, for deciding the shape of first one of a plurality of signal lines to be operated simultaneously, deciding the shape of a second signal line according to the shape of the first signal line, and changing the wiring length of the second signal line according to a difference in the number of bends between the first and second signal lines to thereby make equal the electrical lengths of the signal lines to be operated simultaneously.

The above example is designed so that the second signal line is wired to have the same electrical length as the first signal line to be operated simultaneously therewith, and is not designed so that each signal line is wired to directly satisfy its electrical length constraint of each signal line.

Further, since the above example pays no consideration to a change in the electrical length when there exists in the wiring a bend at a given angle or a thru hole (through which a pin of a component part is inserted for connection) or a via hole, the calculation accuracy of the electrical length will be inevitably reduced.

Explanation will be made in detail in connection with a wiring method and a multi-layer printed wiring board in accordance with an embodiment of the present invention.

Figure 1:
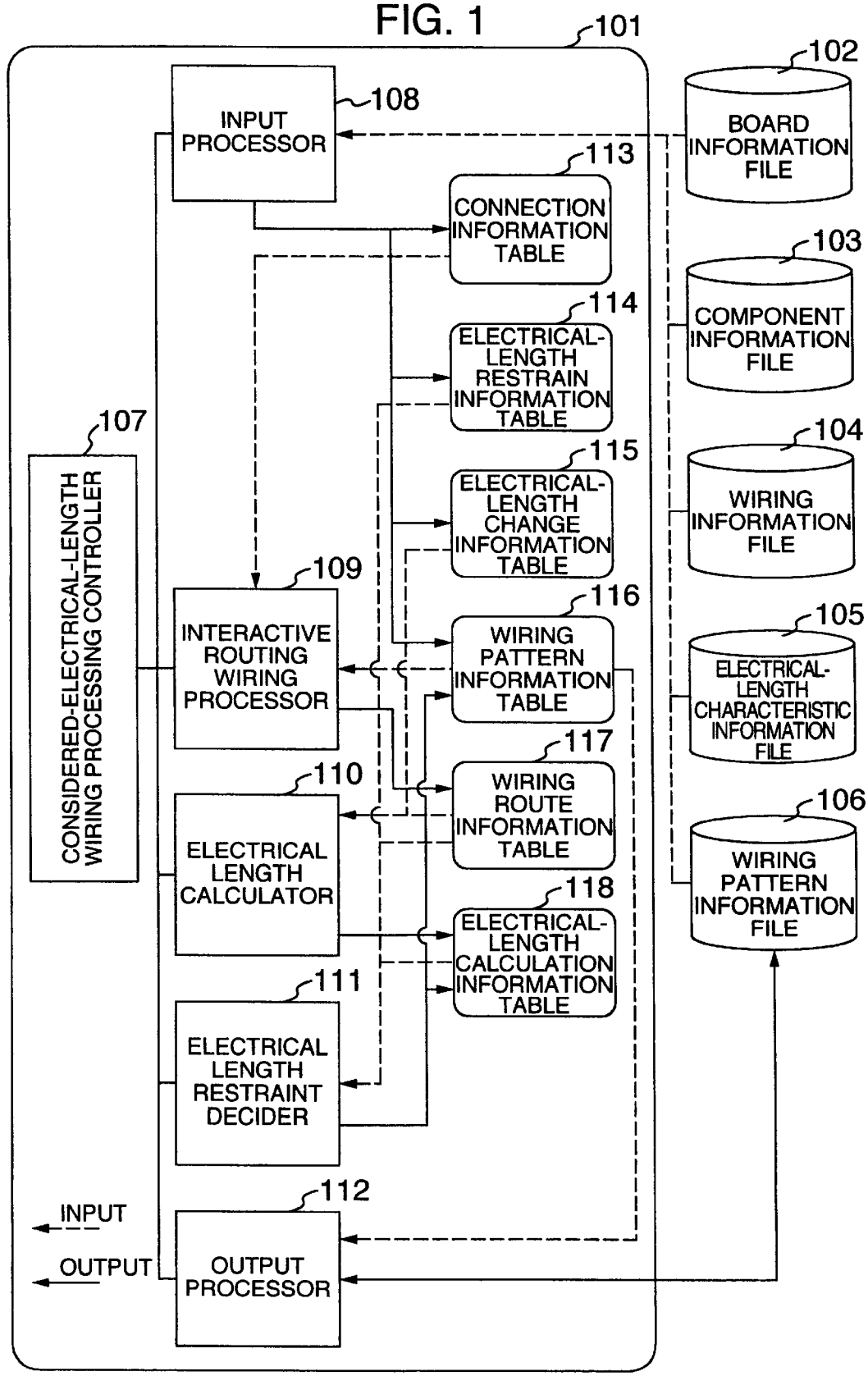
FIG. 1 is a block diagram for explaining a wiring method considering an electrical length in accordance with an embodiment of the present invention.

FIG. 1 shows an example of a wiring processing system which implements the wiring method of the present invention considering the electrical length. FIG. 1 includes a computer 101; a board information file 102 for storing therein physical specifications including the cross section of a multi-layer printed wiring board; a component information file 103 for storing therein component layout information, electrical specifications relating to thru holes and via holes and the like; a wiring information file 104 for storing therein information on connections between components, an electrical length constraint with respect to delay and the like; an electrical-length characteristic information file 105 for storing therein changes in the electrical length with respect to the wiring length at discontinuous delay parts, and so on; and a wiring pattern information file 106 for storing therein wiring pattern information. The computer 101 has a wiring processing program which, after reading information from these information files, functions to perform wiring processing considering the electrical length on the basis of the read-in information and output a wiring pattern obtained by the wiring processing to the wiring pattern information file 106.

That is, the computer 101 has a considered-electrical-length wiring processing controller 107 for controlling the entire processing operation; an input processor 108 to be operated under control of the controller, an interactive routing wiring processor 109, an electrical length calculator 110, an electrical length constraint decider 111, and an output processor 112, as well as a connection information table 113, electrical-length restrain information table 114, electrical-length change information table 115, wiring pattern information table 116, wiring route information table 117 and electrical-length calculation information table 118, created by these processors on the basis of their processed results.

The input processor 108 reads the board information file 102, component information file 103, wiring information file 104, electrical-length characteristic information file 105 and wiring pattern information file 106, and creates predetermined information in the connection information table 113, electrical-length restrain information table 114, electrical-length change information table 115 and wiring pattern information table 116.

The interactive routing wiring processor 109 refers to predetermined information in the connection information table 113 and wiring pattern information table 116 and creates information relating to an interactive wired route in the wiring route information table 117.

The electrical length calculator 110 refers to predetermined information in the electrical-length change information table 115 and wiring route information table 117, and creates information on an electrical length calculation result of the wired route in the electrical-length calculation information table 118.

The electrical length restraints decider 111 refers to predetermined information in the electrical-length restrain information table 114, wiring route information table 117 and electrical-length calculation information table 118, and updates the wiring pattern information table 116 on the basis of an electrical length constraint decision result.

The output processor 112 refers to predetermined information in the wiring pattern information table 116, and outputs information about the wired result to the wiring pattern information file 106.

The considered-electrical-length wiring processing controller 107, simultaneously with the start of its processing operation sequentially starts the input processor 108, interactive routing wiring processor 109, electrical length calculator 110, electrical length restraints decider 111 and output processor 112.

Now a procedure of operations in the considered-electrical-length wiring processing controller 107 will be shown in FIG. 2. First, the considered-electrical-length wiring processing controller 107 starts the input processor 108 for input processing in a step 201 of FIG. 2. The input processing causes the controller to read information relating to a multi-layer printed wiring board to be wired from the board information file 102, component information file 103, wiring information file 104, electrical-length characteristic information file 105 and wiring pattern information file 106; and creates a connection information table 113 having connection information between component pins of signal lines, electrical-length restrain information table 114 having constraint information about the electrical lengths of the signal lines, electrical-length change information table 115 having information about changes in the electrical length to the wiring length at discontinuous delay parts of the signal lines, and wiring pattern information table 116 having information about already-wired wiring patterns.

An example of information on created electrical length changes is shown in FIGS. 3A, 3B, 3C and 3D. In this example, a bend between wiring elements, a thru hole and a via hole are given as discontinuous delay parts of a signal line.

With regard to such a bend between wiring elements as shown in FIG. 3A, such an electrical length change $\delta 1$ as shown in FIG. 3B is set for a bend angle $\theta 1$ between wiring elements P1 and P2. Similarly, electrical length changes $\delta 2$ and $\delta 3$ are set for bend angles $\theta 2$ and $\theta 3$ respectively.

With regard to such thru and via holes as shown in FIG. 3C, the thru and via holes are classified according to the thru- and via-hole making range (layers 1 to n for a thru hole V1, the layers 1 to n for a thru hole V2, and the layers 3 and 4 for a via hole V3) and to the existence layer (the layer 2 where a wiring pattern P3 is present for the thru hole V1, the layers (n-2) and (n-1) where wiring patterns P4 and P5 are present for the thru hole V2, and the layers 3 and 4 where wiring patterns P6 and P7 are present for the via hole V3) of a wiring pattern connected to the thru and via holes, and such electrical length change $\delta'1$, $\delta'2$ and $\delta'3$ as shown in FIG. 3D are set for the thru holes V1 and V2 and via hole V3.

In the present embodiment, these changes are previously found by transmission line simulation enabling 3-D electromagnetic field resolver or by experiments.

Next the considered-electrical-length wiring processing controller 107 selects one of unwired signal lines in a step 202 of FIG. 2, activates the interactive routing wiring processor 109 in a step 203, looks up the connection information table 113 and electrical-length change information table 115, determines a wiring route based on interactive routing, and stores the determined wiring route in the wiring route information table 117.

Thereafter in a step 204, the controller activates the electrical length calculator 110, looks up the electrical-length restrain information table 114 and wiring route information table 117, calculates an electrical length of the wiring route, and stores it in the electrical-length calculation information table 118.

Figure 4:
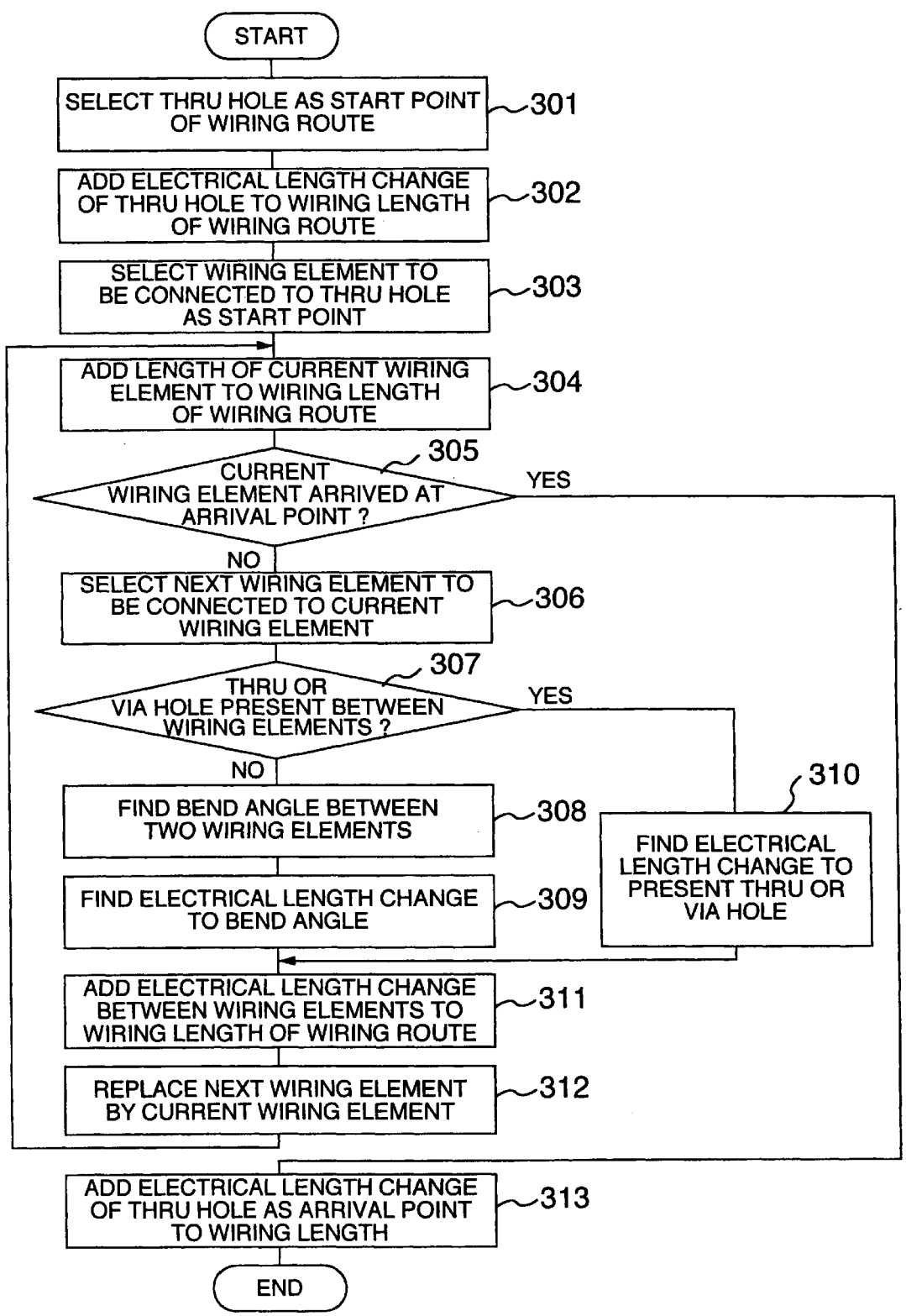
FIG. 4 is a flowchart for explaining the operation of an electrical length calculator 110.

Shown in FIG. 4 is a flowchart for explaining the processing operations of the electrical length calculator 110. In a step 301 of FIG. 4, the electrical length calculator 110 first selects a thru hole as the start point of the wiring route.

In a next step 302, the electrical length calculator 110 finds an electrical length change of the thru hole as the start point and adds the found electrical length change to the wiring length of the wiring route. Subsequently the electrical length calculator 110 selects a wiring element to be connected to the thru hole as the start point in a step 303, and adds the length of the selected current wiring element to the wiring length of the wiring route in a step 304.

Thereafter, it is determined whether or not the current wiring element reached the arrival point of the wiring route in a step 305. If not, then the calculator selects a next wiring element to be connected to the current wiring element in a step 306.

In a next step 307, the calculator judges whether or not there is a through hole or via hole between the current and next wiring elements. In the absence of such a thru or via hole, the calculator proceeds to a step 308 to find a bend angle between the two wiring elements. The calculator finds an electrical length change to the bend angle in a step 309 and goes to a step 311.

In the presence of a thru or via hole, the calculator finds an electrical length change to the present thru or via hole in a step 310, and then proceeds to the step 311.

Subsequently, the calculator adds the found electrical length change to the wiring length of the wiring route in the step 311 and replaces the current wiring element by a next wiring element in a step 312.

Thereafter the steps 304 to 312 are receptively executed until the current wiring element reaches its arrival point.

Finally when the current wiring element reaches the arrival point, the calculator goes from the step 305 to the step 312 to find an electrical length change of the thru hole as the arrival point and add the found electrical length change to the wiring length of the wiring route.

Figure 5:
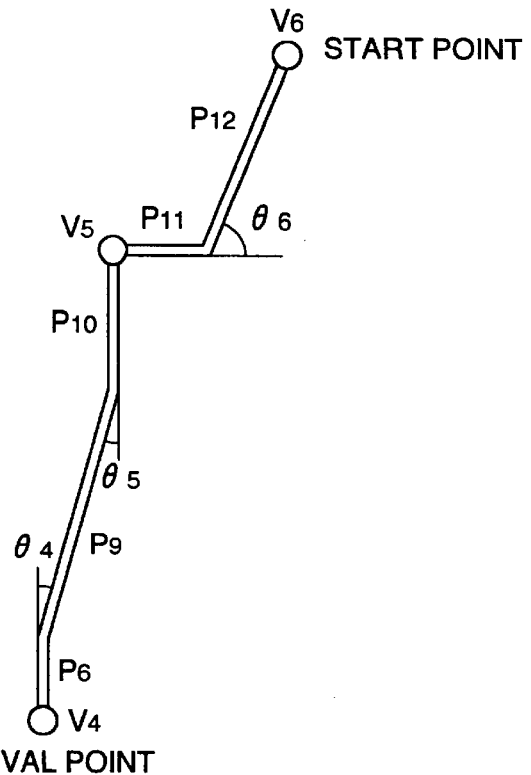
FIG. 5 is a diagram for explaining an example of how to calculate an electrical length.

An example of how to calculate an electrical length is shown in FIG. 5. When such a signal line is given as starts with a thru hole V4 for insertion of a component pin, extends through wiring elements P8, P9 and P10 and through the via hole V5 for layer change and then arrives at the thru hole V6 for insertion of a component pin; assume that the electrical lengths until the wiring elements P8 to P12 are denoted by L8 to L12 respectively, electrical length changes to a bend angle θ4 between the wiring elements P8 and P9 and a bend angle θ5 between the wiring elements P9 and P10 and a bend angle θ6 between the wiring elements P11 and P12 are denoted by δ4, δ5 and δ6 respectively, and electrical length changes to the thru and via holes V4, V6 and V5 are denoted by δ'4, δ'6 and δ'5 respectively. Then an electrical length E is calculated as follows.

$$E = \sum_{i=8}^{12} Li + \sum_{j=4}^{6} \delta j + \sum_{k=4}^{6} \delta' k$$

Next, in a step 205 of FIG. 2, the considered-electrical-length wiring processing controller 107 activates the electrical length restraints decider 111, looks up the electrical-length restrain information table 114 and electrical-length calculation information table 118, and judges whether or not the electrical length of the wiring route calculated in a step 204 satisfies an electrical length constraint. When the electrical length constraint is satisfied, the controller registers contents of the wiring route information table 117 in the wiring pattern information table 116 in a step 206. When the electrical length constraint is not satisfied, the controllers returns to the step 203 to activate the interactive routing wiring processor 109 to retry the interactive routing. Through the retry, the lengths of the wiring elements, the angles between the wiring elements, and the positions of the thru and via holes are reset.

Thereafter, the controller judges whether or not an unwired signal line remains in a step 207, and receptively executes the steps 202 to 207 until no unwired signal line remains. Finally, the controller activates the output processor 112, looks up the wiring pattern information table 116, and outputs a result of the step 206 to the wiring pattern information file 106 in a step 208, at which stage all the operations are completed.

In this way, an electrical length constraint can be accurately satisfied for all the wiring lines to be designed and thus a printed wiring board having a high operational frequency circuit mounted thereon can be realized.

In accordance with the present invention, since the electrical length of the signal line is calculated considering an electrical length change to a wiring length generated at the discontinuous delay part of the signal line and wiring is carried out to satisfy the electrical length constraint, there can be obtained a wiring pattern whose electrical length is desirably constrained accurately. As a result, there can be realized a multi-layer printed wiring board which can carry a circuit having a high operational frequency thereon.

What is claimed is:

1. A method for wiring a signal line for connection of a circuit on a multi-layer printed wiring board, comprising the steps of:

providing a constraint of an electrical length which said signal line must satisfy;

determining an electrical length change at a bend between wiring elements which are straight parts of a wiring pattern;

calculating an electrical length of said signal line with use of a wiring length of said signal line and said determined electrical length change; and determining a wiring route in such a manner that said calculated electrical length satisfies said electrical length constraint.

2. A wiring method as set forth in claim 1, wherein said step of determining said electrical length change includes a step of determining an electrical length change to thru and via holes.

3. A wiring method as set forth in claim 2, wherein said step of determining an electrical length change to thru and via holes includes a step of determining an electrical length change for each of types of the thru and via holes.

4. A method for determining a wiring pattern of a signal line for connection of a circuit on a multilayer printed wiring board, comprising the steps of:

providing a constraint of an electrical length which said signal line must satisfy; determining an electrical length change at a bend between wiring elements which are straight parts of a wiring pattern;

determining a wiring route of said signal line;

calculating an electrical length of said signal line with use of a wiring length of said signal line and said determined electrical length change;

judging whether or not said calculated electrical length satisfies said electrical length constraint given to said signal line; and determining said wiring route as a wiring pattern when the electrical length constraint is satisfied as said decision result.

5. A wiring pattern decision method as set forth in claim 4, further comprising a step of changing a wiring route when the electrical length constraint is not satisfied as said decision result.

6. A wiring pattern decision method as set forth in claim 4, wherein said step of determining an electrical length change includes a step of determining an electrical length change to thru and via holes.

7. A wiring pattern decision method as set forth in claim 4, wherein said step of determining a wiring route of the signal line includes a step of determining a wiring route by interactive routing.

8. A program for wiring of a signal line for causing a computer to be executed to connect a circuit on a multi-layer printed wiring board, comprising the steps of:

providing an electrical length constraint which said signal line must satisfy;

determining an electrical length change at bend between wiring elements which are straight parts of a wiring pattern;

calculating an electrical length of said signal line with use of a wiring length of said signal line and said determined electrical length change; and determining a wiring route in such a manner that said calculated electrical length satisfies said electrical length constraint given to said signal line.

9. A program for decision of a wiring pattern of a signal line for causing a computer to be executed to connect a circuit on a multi-layer printed wiring board, comprising the steps of:

providing an electrical length constraint which said signal line must satisfy;

determining an electrical length change at a bend between wiring elements which are straight parts of a wiring pattern;

determining a wiring route of said signal line;

calculating an electrical length of said signal line with use of a wiring length of said signal line and said determined electrical length change;

deciding whether or not said calculated electrical length satisfies said electrical length constraint given to said signal line; and determining said wiring route as a wiring pattern when the electrical length constraint is satisfied as a result of said decision.

10. A multi-layer printed wiring board formed thereon with a signal line to connect a circuit on the board, wherein an electrical length of a signal line is calculated with use of a electrical length change at a bend angle between wiring elements which are straight parts of a wiring pattern and wherein a wiring length of the signal line, and a wiring route is determined such that the calculated electrical length satisfies an electrical length constraint given to said signal line.

* * * * *